United States Patent
Su et al.

(10) Patent No.: US 10,461,145 B2
(45) Date of Patent: Oct. 29, 2019

(54) METHOD FOR FABRICATING MAGNETIC CORE

(71) Applicant: TAIWAN SEMICONDUCTOR MANUFACTURING CO., LTD., Hsinchu (TW)

(72) Inventors: Yen-Shuo Su, Hsinchu County (TW); Chun-Tsung Kuo, Tainan (TW); Jiech-Fun Lu, Tainan County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/880,289

(22) Filed: Jan. 25, 2018

(65) Prior Publication Data

US 2018/0166527 A1 Jun. 14, 2018

Related U.S. Application Data

(62) Division of application No. 14/632,519, filed on Feb. 26, 2015, now Pat. No. 9,893,141.

(51) Int. Cl.
| | |
|---|---|
| H01L 49/02 | (2006.01) |
| H01F 17/00 | (2006.01) |
| H01F 41/04 | (2006.01) |

(52) U.S. Cl.
CPC ......... H01L 28/10 (2013.01); H01F 17/0033 (2013.01); H01F 41/046 (2013.01)

(58) Field of Classification Search
CPC ..... H01L 28/10; H01F 17/0033; H01F 41/046
See application file for complete search history.

(56) References Cited

U.S. PATENT DOCUMENTS

| | | | |
|---|---|---|---|
| 6,249,039 B1 | 6/2001 | Harvey et al. | |
| 6,492,708 B2 | 12/2002 | Acosta et al. | |
| 6,562,251 B1* | 5/2003 | Jordan | G11B 5/3106 |
| | | | 216/22 |
| 9,048,128 B2* | 6/2015 | Tseng | H01L 28/10 |
| 2012/0242438 A1* | 9/2012 | Morise | H01F 10/3295 |
| | | | 335/302 |
| 2015/0340422 A1 | 11/2015 | Lee et al. | |
| 2016/0155935 A1* | 6/2016 | Eissa | C23F 1/02 |
| | | | 438/48 |

FOREIGN PATENT DOCUMENTS

| | | |
|---|---|---|
| CN | 102789967 A | 11/2012 |
| JP | 200252846 A | 8/2002 |
| JP | 2002-358607 A | 12/2002 |
| KR | 10 0174460 A | 4/1999 |
| KR | 10-2004-0072022 A | 8/2004 |
| WO | 02/073702 A1 | 9/2002 |

* cited by examiner

*Primary Examiner* — Shaun M Campbell
(74) *Attorney, Agent, or Firm* — Maschoff Brennan

(57) ABSTRACT

A method for fabricating a magnetic core includes depositing a magnetic layer on a dielectric layer, forming a first photoresist layer on the magnetic layer and patterning the first photoresist layer, etching the magnetic layer through the patterned first photoresist layer, in which a first section of the magnetic layer exposed by the first photoresist layer remains on the dielectric layer after the magnetic layer is etched, removing the patterned first photoresist layer, forming a second photoresist layer on the magnetic layer and patterning the second photoresist layer, etching the magnetic layer through the patterned second photoresist layer, and removing the second photoresist layer.

20 Claims, 6 Drawing Sheets

METHOD FOR FABRICATING MAGNETIC CORE

PRIORITY CLAIM AND CROSS-REFERENCE

The present application is a divisional of U.S. application Ser. No. 14/632,519, filed Feb. 26, 2015, which is herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
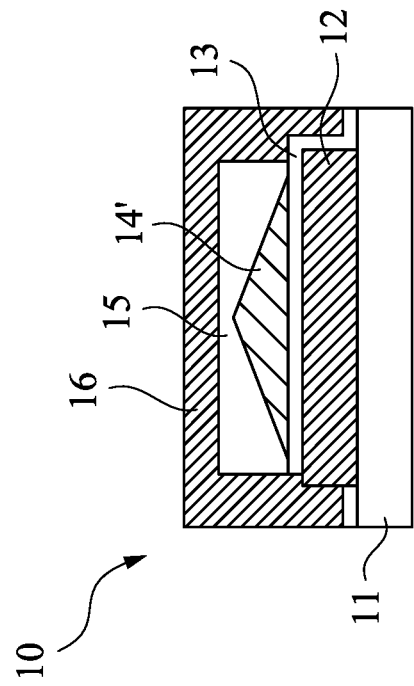
FIG. 1 is a cross-sectional view of an ideal embodiment of an inductor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Inductors are used in a wide array of applications such as signal processing, noise filtering, power generation, electrical transmission systems etc. In order to provide more compact and more efficient inductors, the electrically conducting winding of the inductor may be arranged around an elongated magnetically conducting core, i.e. a magnetic core. The magnetic core is made of a material presenting a higher permeability than air wherein the magnetic core may enable an inductor of increased inductance. Magnetic cores are available in a large variety of designs and materials, each having their specific advantages and disadvantages. However, due to the increasing demand for inductors in different applications requiring less space there is still a need for inductors and magnetic cores having a compact and efficient design and thereby being usable in a wide range of applications.

FIG. 1 is a cross-sectional view of an ideal embodiment of an inductor. The inductor 10 includes a substrate 11, a bottom conductive layer 12 formed on the substrate 11, a bottom dielectric layer 13 formed on the bottom conductive layer 12, a magnetic core 14 formed on the bottom dielectric layer 13, a top dielectric layer 15 formed on the magnetic core 14, and a top conductive layer 16 formed on the top dielectric layer 15.

In the ideal embodiment, the magnetic core 14 is in a shape of rectangle. Namely, the volume loss when the magnetic core 14 is made can be ignored. The bottom conductive layer 12 and the top conductive layer 16 are patterned and are divided into a plurality of strips. The striped bottom conductive layer 12 and the striped top conductive layer 16 form a spiral structure winding on the magnetic core 14.

However, the magnetic core 14 is made of magnetic materials, such as cobalt zirconium tantalum (CZT), nickel iron (NiFe), or iron nitride (FeN). The magnetic materials are difficult to be dry etched. Therefore, a wet etching process is utilized in forming the magnetic core 14.

Figure 2:
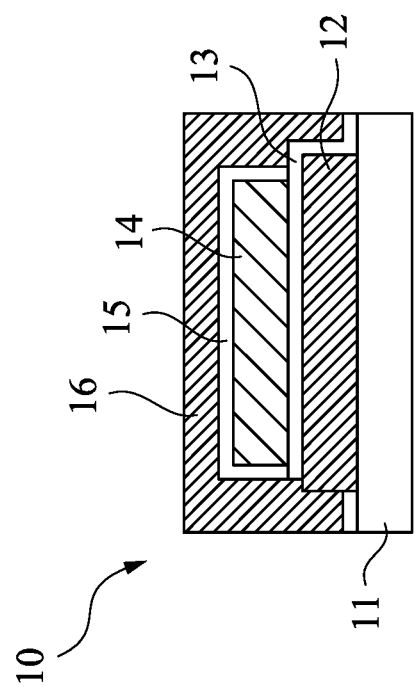
FIG. 2 is a cross-sectional view of a real embodiment of a conventional inductor.

FIG. 2 is a cross-sectional view of a real embodiment of a conventional inductor. The difference between the real embodiment and the ideal embodiment is the shape of the magnetic core 14'. As described above, the magnetic core 14' is formed by a wet etching process, which is an anisotropic etching to the magnetic materials. Anisotropic etching means different etch rates in different directions in the material. The result of etching the magnetic core 14' with the anisotropic etching is a pyramid shaped surface, e.g. top/bottom width of the magnetic core 14' is shortened. The pyramid shaped magnetic core 14' occurs to volume loss and leads to worse inductor performance.

In order to prevent above situation, the present disclosure provides a method for fabricating a magnetic core by using multiple wet etching processes, such that the profile of the magnetic core can be more rectangular thereby providing better inductor performance.

Figure 3:
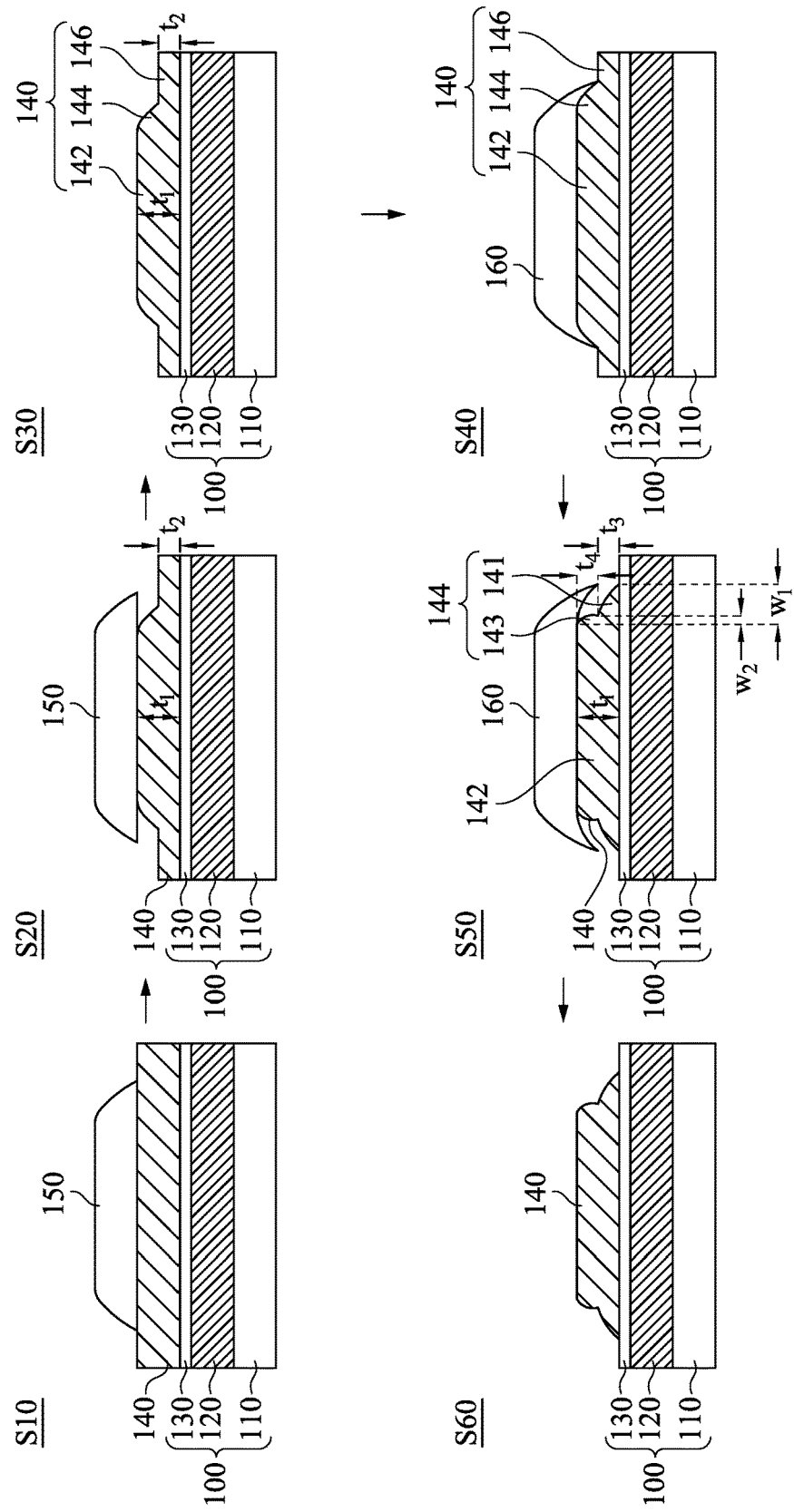
FIG. 3 is a cross-sectional view of different steps of a method for fabricating a magnetic core, in accordance with some embodiments.

FIG. 3 is a cross-sectional view of different steps of a method for fabricating a magnetic core, in accordance with some embodiments. The method starts at step S10. Step S10 is forming a photoresist layer 150 on a magnetic layer 140. The magnetic layer 140 is formed on a lamination structure 100. The lamination structure 100 includes a substrate 110, a conductive layer 120 formed on the substrate 110, and a dielectric layer 130 formed on the conductive layer 120.

The substrate 110 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The conductive layer 120 is made of conductive material, for example, W, Co, Al, or Cu. The conductive layer 120 can be formed by a deposition process. The dielectric layer 130 may have a dielectric constant greater than about 3.5. The dielectric layer 130 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$). The dielectric layer 130 is formed by, for example low-pressure chemical vapor deposition (LP-CVD). The magnetic layer 140 is made of magnetic materials, such as cobalt zirconium tantalum (CZT), nickel iron (NiFe), or iron nitride (FeN).

The photoresist layer 150 is patterned by a lithography process to form a feature on the magnetic layer 140. The pattern of the photoresist layer 150 is formed in accordance with a predetermined size of the magnetic core. The lithography process may include photoresist coating, exposing, post-exposure baking, and developing. The lithography process used to form the photoresist pattern may include photoresist coating, exposing, post-exposure baking, and developing. The lithography process may additionally include soft baking, mask aligning, and/or hard baking. The lithography process may utilize other exposing modes or technologies, such as on-axis, off-axis, quadripole, or dipole exposure technologies. The optical exposing process may alternatively be implemented or replaced by other proper methods such as maskless lithography, electron-beam writing, ion-beam writing, and molecular imprint techniques.

Step S20 is etching the magnetic layer 140. The magnetic layer 140 is etched by a wet etching process. The wet etching process includes placing the lamination structure 100, the magnetic layer 140 and the photoresist layer 150 thereon into an acid. The acid can include organic acid, such as benzenedicarboxylic acid, naphthalenedicarboxylic acid, benzenetricarboxylic acid, naphthalenetricarboxylic acid, pyridinedicarboxylic acid, bipyridyldicarboxylic acid, formic acid, oxalic acid, malonic acid, succinic acid, glutaric acid, hexanedioic acid, heptanedioic acid and cyclohexyldicarboxylic acid, etc. The acid can include inorganic acid, such as HF, HCl, HBr, HI, $HNO_3$, $H_3PO_4$, $H_2SO_4$, $HClO_4$, or a mixture thereof.

In this step, the magnetic layer 140 is etched partially. There is still a magnetic layer 140 completely covering the dielectric layer 130 after the magnetic layer 140 is wet etched. The portion of the magnetic layer 140 covered by the photoresist layer 150 has a maximum thickness $t_1$, the portion of the magnetic layer 140 exposed of the photoresist layer 150 has a minimum thickness $t_2$, and the thickness of the magnetic layer 140 is gradually decreased from $t_1$ to $t_2$ at the edge under the photoresist layer 150. The etching ratio of the magnetic layer 140 is controlled by the time being placing in the acid.

Step S30 is removing the photoresist layer 150. The photoresist layer 150 is removed by a photoresist stripping process. The photoresist process can be performed by one or more wet stripping processes or one or more dry stripping processes. The magnetic layer 140 includes three sections 142, 144, 146, in which the section 142 has a substantially uniform thickness $t_1$, the section 146 has a substantially uniform thickness $t_2$, and the section 144 bridges the section 142 and the section 146. The thickness $t_1$ of the section 142 is greater than the thickness of the section 144, and the thickness of the section 144 is greater than the thickness $t_2$ of the section 146.

Step S40 is forming another photoresist layer 160 on the magnetic layer 140. The photoresist layer 160 is defined by the same mask of defining the photoresist layer 150. Namely, the pattern and the position of the photoresist layer 160 is substantially the same as that of the photoresist layer 150. The sections 142 and 144 are once again covered by the photoresist layer 160, and the section 146 is exposed of the photoresist layer 160.

Step S50 is etching the magnetic layer 140. The magnetic layer 140 is etched by a wet etching process. In some embodiments, the acid utilized in step S50 is substantially the same as the acid utilized in step S20. In some embodiments, the acid utilized in step S50 is different from the acid utilized in step S20. The section 146 of the magnetic layer 140 is removed from the dielectric layer 130. The dielectric layer 130 uncovered by the photoresist layer 160 is exposed of the magnetic layer 140. The section 144 of the magnetic layer 140 is wet etched and has at least two slopes at the edge of the section 144. The section 142 of the magnetic layer 140 is covered by the photoresist layer 160, and the section 142 still has the uniform thickness $t_1$.

The time of the wet etching processes in step S20 and step S50 decides the shape of the magnetic layer 140. More particularly, the time of the wet etching processes in step S20 and step S50 decides the shape of the section 144, which is located at the edge of the magnetic layer 140. In some embodiments, the section 144 includes a bottom portion 141 and a top portion 143 disposed on and connected to the bottom portion 141. The bottom portion 141 is mainly wet etched by step S50. The top portion 143 is mainly wet etched by both step S20 and step S50. The side surface of the top portion 143 is steeper than that of the bottom portion 141. The bottom portion 141 has a gradual side surface since the top portion 143 has a steep side surface. In some embodiments, the bottom portion 141 has an inclined side surface, and the top portion 143 has a curve side surface. The width $w_1$ of the bottom potion 141 extended from the section 142 is also greater than the width $w_2$ of the top portion 143 extended from the section 142. The bottom portion 141 has a thickness $t_3$, and the top portion 143 has a thickness $t_4$. The sum of the thickness $t_3$ and the thickness $t_4$ is substantially equals to the thickness $t_1$ of the section 142. The ratio of the thickness $t_3$ to the thickness $t_4$ is determined by the time of step S20 and step S50. The ratio of the thickness $t_3$ to the thickness $t_4$ is in a range from about 2/3 to about 3/2. In some embodiments, the ratio of the thickness $t_3$ to the thickness $t_4$ is in a range from about 3/7 to about 7/3. If the ratio is higher or lower than above ratio, the shape of the section 144 would be in a shape of triangle, and the section 144 would have greater width extended from the section 142, such situation is unwanted and raises the issue of volume loss.

Step S60 is removing the photoresist layer 160. The photoresist layer 160 is removed by a photoresist stripping process. The photoresist process can be performed by one or more wet stripping processes or one or more dry stripping processes. After the photoresist layer 160 is removed, the patterned magnetic layer 140 can be utilized as the magnetic core in a semiconductor component, such as an inductor. The shape of the patterned magnetic layer 140 is more like a rectangle rather than a triangle. Thus the inductor using the design may have larger magnetic core, and the performance of the inductor is also improved.

Figure 4:
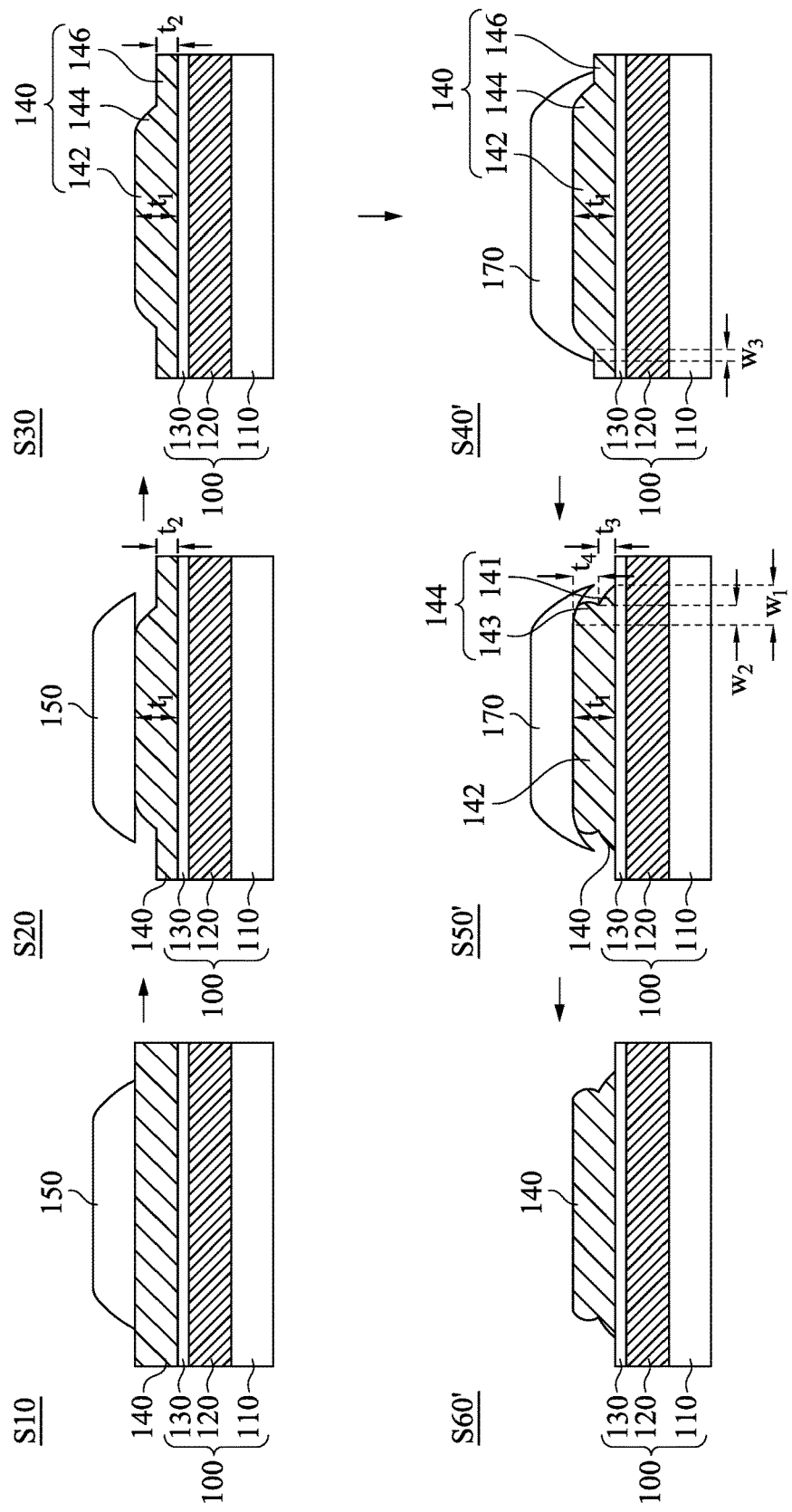
FIG. 4 is a cross-sectional view of different steps of the method for fabricating the magnetic core, in accordance with some embodiments.

FIG. 4 is a cross-sectional view of different steps of the method for fabricating the magnetic core, in accordance with some embodiments. The step S10 to step S30 are substantially the same as the step S10 to step S30 discussed in FIG. 3. The differences between FIG. 4 and FIG. 3 starts at step S40'. Step S40' is forming another photoresist layer 170 on the magnetic layer 140. The photoresist layer 170 utilized in step S40' is different from the photoresist layer utilized in step S10. The photoresist layer 150 and the photoresist layer 170 are defined by different masks.

In step S40', the feature of the photoresist layer 170 is larger than the feature of the photoresist layer 150. The magnetic layer 140 includes three sections 142, 144, 146, in which the section 142 has a substantially uniform thickness $t_1$, the section 146 has a substantially uniform thickness $t_2$, and the section 144 bridges the section 142 and the section 146. The thickness $t_1$ of the section 142 is greater than the thickness of the section 144, and the thickness of the section 144 is greater than the thickness $t_2$ of the section 146. The photoresist layer 170 mainly covers on the section 142 and 144, and an edge portion of the photoresist layer 170 covers on the section 146. The width $w_3$ of the photoresist layer 170 covering on the section 146 is in a range from about 1 μm to about 5 μm.

Step S50' is etching the magnetic layer 140. The magnetic layer 140 is etched by a wet etching process. In some embodiments, the acid utilized in step S50' is substantially the same as the acid utilized in step S20. In some embodiments, the acid utilized in step S50' is different from the acid utilized in step S20. The section 146 of the magnetic layer 140 is removed from the dielectric layer 130. The dielectric layer 130 uncovered by the photoresist layer 170 is exposed of the magnetic layer 140. The section 144 of the magnetic layer 140 is wet etched and has at least two slopes at the edge of the section 144. The section 142 of the magnetic layer 140 is covered by the photoresist layer 170, and the section 142 still has the uniform thickness $t_1$.

The time of the wet etching processes in step S20 and step S50' decides the shape of the magnetic layer 140. More particularly, the time of the wet etching processes in step S20 and step S50' decides the shape of the section 144, which is located at the edge of the magnetic layer 140. In some embodiments, the section 144 includes a bottom portion 141 and a top portion 143 disposed on and connected to the bottom portion 141. The bottom portion 141 is mainly wet etched by step S50'. The top portion 143 is mainly wet etched by both step S20 and step S50'. The slope of the bottom portion 141 is smaller than the slope of the top portion 143. The bottom portion 141 has a gradual side surface since the top surface 143 has a steep side surface. In some embodiments, the bottom portion 141 has an inclined side surface, and the top portion 143 has a curve side surface.

The width $w_1$ of the bottom potion 141 extended from the section 142 is also greater than the width $w_2$ of the top portion 143 extended from the section 142. The width $w_2$ is greater than that in FIG. 3. The volume of the section 144 is also greater than that in FIG. 3. The profile of the patterned magnetic layer 140 is similar to a rectangle.

The bottom portion 141 has a thickness $t_3$, and the top portion 143 has a thickness $t_4$. The sum of the thickness $t_3$ and the thickness $t_4$ is substantially equals to the thickness $t_1$ of the section 142. The ratio of the thickness $t_3$ to the thickness $t_4$ is determined by the time of step S20 and step S50'. The ratio of the thickness $t_3$ to the thickness $t_4$ is in a range from about 2/3 to about 3/2. In some embodiments, the ratio of the thickness $t_3$ to the thickness $t_4$ is in a range from about 3/7 to about 7/3. If the ratio is higher or lower than above ratio, the shape of the section 144 would be in a shape of triangle, and the section 144 would have greater width extended from the section 142, such situation is unwanted and raises the issue of volume loss.

Step S60' is removing the photoresist layer 170. The photoresist layer 170 is removed by a photoresist stripping process. The photoresist process can be performed by one or more wet stripping processes or one or more dry stripping processes. After the photoresist layer 170 is removed, the patterned magnetic layer 140 can be utilized as the magnetic core in a semiconductor component, such as an inductor. The shape of the patterned magnetic layer 140 is more like a rectangle than that in FIG. 3. The inductor using the design may have larger magnetic core, and the performance of the inductor is also improved.

Figure 5:
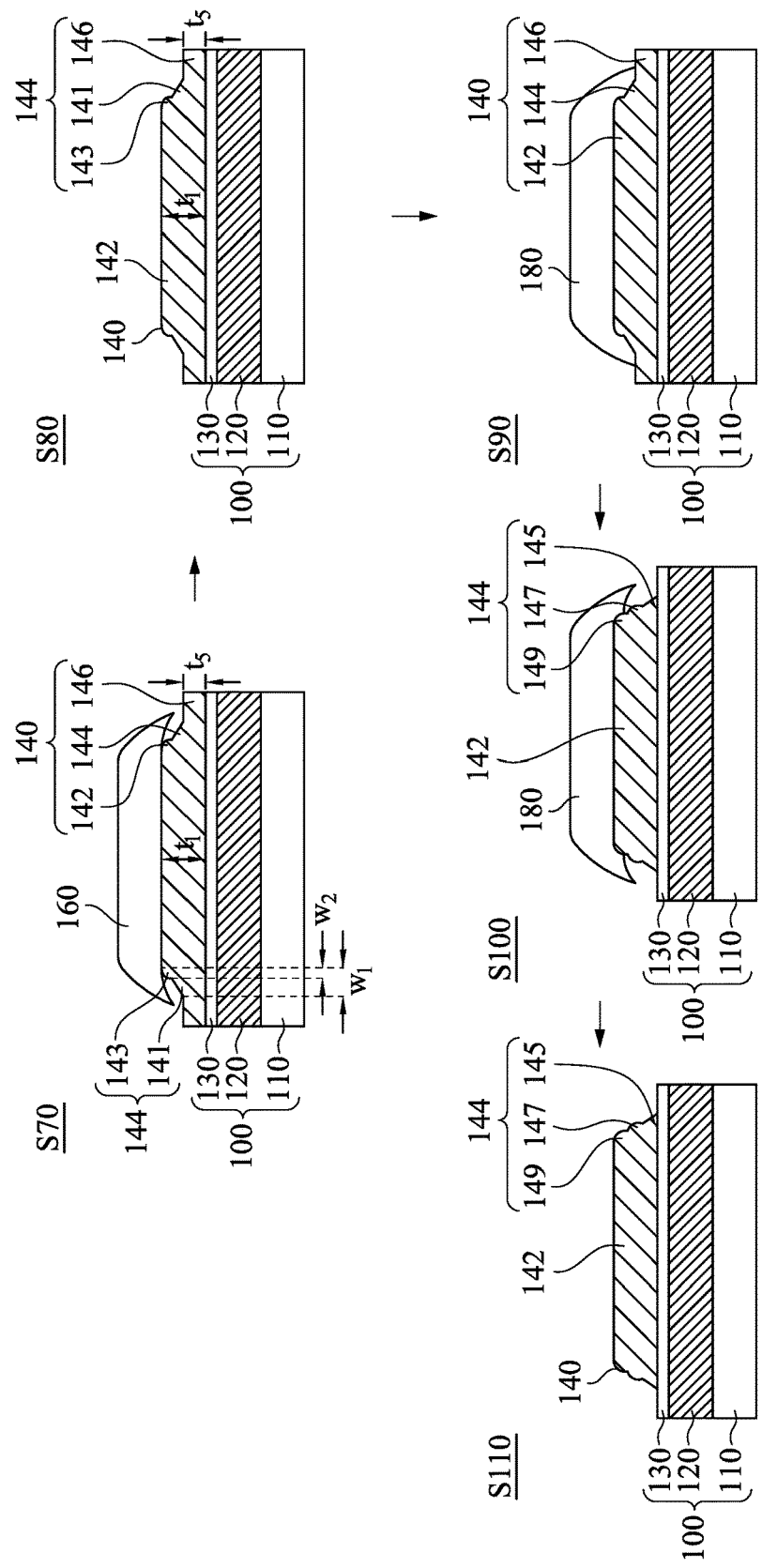
FIG. 5 is a cross-sectional view of different steps of the method for fabricating the magnetic core, in accordance with some embodiments.

FIG. 5 is a cross-sectional view of different steps of the method for fabricating the magnetic core, in accordance with some embodiments. The method may optionally include step S70 to step S90, which follow after the step S10 to step S40 discussed in FIG. 3 (or step S10 to step S40' discussed in FIG. 4).

Step S70 is etching the magnetic layer 140. The magnetic layer 140 is etched by a wet etching process. In some embodiments, the acid utilized in step S70 is substantially the same as the acid utilized in step S20. In some embodiments, the acid utilized in step S70 is different from the acid utilized in step S20. The magnetic layer 140 is covered by the photoresist layer 160, which is substantially the same as the photoresist layer 140 (or the photoresist layer 170, which has larger feature than that of the photoresist layer 140) on the magnetic layer 140. More particularly, the sections 142 and 144 are covered by the photoresist layer 160, and the section 146 is exposed of the photoresist layer 160. The sections 144 and 146 are wet etched. The section 146 becomes thinner and has a minimum thickness $t_5$, the section 142 covered by the photoresist layer 160 has a maximum thickness $t_1$, and the section 144 bridges the sections 142 and 146. The section 144 under the edge of the photoresist layer 160 includes a bottom portion 141 and the top portion 143, in which the bottom portion 141 connects the section 146 to the top portion 143. The width $w_1$ of the bottom portion 141 extended from the section 142 is greater than the width $w_2$ of the top portion extended from the section 142.

Step S80 is removing the photoresist layer 160. The photoresist layer 160 is removed by a photoresist stripping process. The photoresist process can be performed by one or more wet stripping processes or one or more dry stripping processes. The magnetic layer 140 includes the section 142 with the uniform thickness $t_1$, the section 146 with the uniform thickness $t_5$, and the section 144 bridges the sections 142 and 146. The section 144 includes the bottom portion 141 and the top portion 143. The bottom portion 141 has a gradual side surface since the top portion 143 has a steep side surface. In some embodiments, the bottom portion 141 has an inclined side surface, and the top portion 143 has a curve side surface. Step S90 is forming yet another photoresist layer 180 on the magnetic layer 140. The magnetic layer 140 includes the section 142, the section 144, and the section 146. The photoresist layer 180 covers the sections 142 and 144. The section 146 is exposed of the photoresist layer 180. The feature of the photoresist layer 180 can be the same as or larger than that of photoresist layer 160.

Step S100 is etching the magnetic layer 140. The magnetic layer 140 is etched by a wet etching process. In some embodiments, the acid utilized in step S100 is substantially the same as the acid utilized in step S20 and step S50 (step S50'). In some embodiments, the acid utilized in step S100 is different from that in step S20 and step S50 (step S50'). The section 146 exposed of the photoresist layer 180 is removed, and the dielectric layer 130 uncovered by the photoresist layer 180 is exposed. Meanwhile, the edge of the section 144 under the edge of the photoresist layer 180 is removed.

The section 144 now includes three portions 145, 147, 149, in which the portion 145 is disposed on the dielectric layer 130, the portion 147 is disposed on the portion 145, and the portion 149 is disposed on the portion 147. Namely, the portion 145 can be regarded as a bottom portion, the portion 147 can be regarded as a middle portion, and the portion 149 can be regarded as a top portion. The top portion 149 is mainly wet etched by the step S20, the step S50 (S50'), and the step S100, and the top potion 149 has a curve side surface. The middle portion 147 is mainly wet etched by the step S50 (S50') and the step S100, and the middle portion 147 has a curve side surface. The bottom portion 145 is mainly wet etched by the step S100, and the bottom portion 145 has an inclined side surface. The width of the bottom portion extended from the section 142 is shortened. The thickness of the bottom portion 145, the middle portion 147, and the top portion 149 can be control by the time of wet etching the magnetic layer 140 in step S20, step S50 (S50'), and step S100.

Step S110 is removing the photoresist layer 180. The photoresist layer 180 is removed by a photoresist stripping process. The photoresist process can be performed by one or more wet stripping processes or one or more dry stripping processes. After the photoresist layer 180 is removed, the patterned magnetic layer 140 can be utilized as the magnetic core in a semiconductor component, such as an inductor. The patterned magnetic layer 140 includes the section 142 with the uniform thickness and the section 144 connected to the section 142. The section 142 is surrounded by the section 144. The section 144 has more than three different slopes. The shape of the patterned magnetic layer 140 provided by step S110 is more like a rectangle since the width of the bottom portion 145 and the middle portion 147 are shortened by multiple wet etching processes. The volume of the magnetic core (the patterned magnetic layer 140) is enhanced. The performance of the inductor using the magnetic core is also improved.

Figure 6:
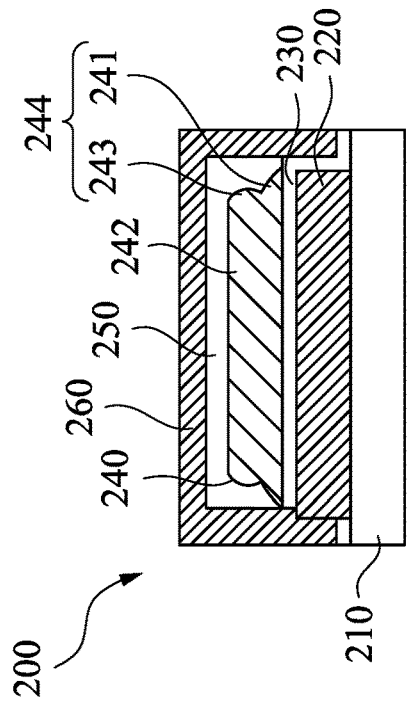
FIG. 6 is a cross-sectional view of an inductor, in accordance with some embodiments.

FIG. 6 is a cross-sectional view of an inductor, in accordance with some embodiments. The inductor 200 includes a substrate 210, a bottom conductive layer 220 formed on the substrate 210, a bottom dielectric layer 230 formed on the bottom conductive layer 220, a top dielectric layer 250 formed on the magnetic core 240, and a top conductive layer 260 formed on the top dielectric layer 250.

The substrate 210 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The bottom conductive layer 220 and the top conductive layer 260 are made of conductive material, for example, W, Co, Al, or Cu. The bottom dielectric layer 230 and the top dielectric layer 250 may have a dielectric constant greater than about 3.5. The bottom dielectric layer 230 and the top dielectric layer 250 are made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$). The magnetic core 240 is made of magnetic materials, such as cobalt zirconium tantalum (CZT), nickel iron (NiFe), or iron nitride (FeN). The bottom conductive layer 220 and the top conductive layer 260 form a winding wire wound on the magnetic core 240.

The magnetic core 240 is fabricated by the method disclosed in FIG. 3. The magnetic core 240 includes a center section 242 and an edge section 244 connected to the center section 242. The center section 242 is surrounded by the edge section 244. The edge section 244 includes at least two different slopes. The edge section 244 includes a bottom portion 241 and a top portion 243 disposed on and connected to the bottom portion 241. The center section 242 has a substantially uniform thickness. The width of the bottom portion 241 extended from the center section 242 is greater than the width of the top portion 243 extended from the center section 242. The bottom portion 241 has a gradual side surface since the top portion 243 has a steep side surface. In some embodiments, the bottom portion 241 has an inclined side surface, and the top portion 143 has a curve side surface. The ratio of the thickness of the bottom portion to the thickness of the top portion is in a range from about 2/3 to about 3/2. In some embodiments, the ratio is in a range from about 3/7 to about 7/3. If the ratio is higher or lower than above ratio, the shape of the edge section 244 would be in a shape of triangle, and the edge section 244 would have greater width extended from the center section 242, such situation is unwanted and raises the issue of volume loss. The existence of the top portion 243 enlarges the volume of the magnetic core 240 (comparing with the transitional magnetic core 14' disclosed in FIG. 2). Thus the performance of the inductor 200 is improved.

Figure 7:
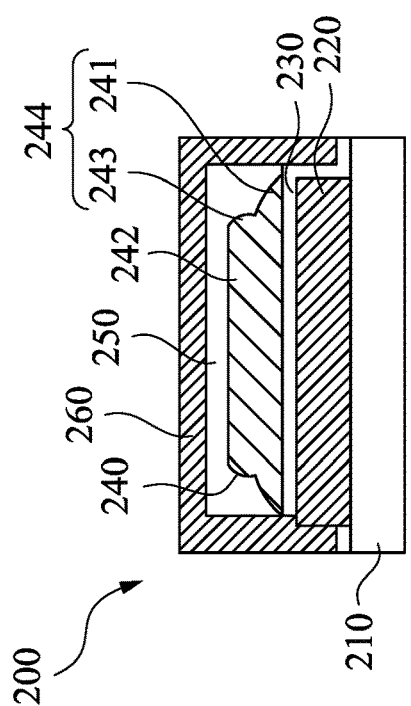
FIG. 7 is a cross-sectional view of the inductor, in accordance with some embodiments.

FIG. 7 is a cross-sectional view of the inductor, in accordance with some embodiments. The difference between the FIG. 7 and FIG. 6 is that the magnetic core 240 of FIG. 7 is fabricated by the method disclosed in FIG. 4. The magnetic core 240 includes a center section 242 and an edge section 244 connected to the center section 242. The center section 242 is surrounded by the edge section 244. The edge section 244 includes at least two different slopes. The edge section 244 includes a bottom portion 241 and a top portion 243 disposed on and connected to the bottom portion 241. The center section 242 has a substantially uniform thickness. The width of the bottom portion 241 extended from the center section 242 is shorter than that disclosed in FIG. 6, but still greater than the width of the top portion 243 extended from the center section 242. The bottom portion 241 has a gradual side surface since the top portion 243 has a steep side surface. In some embodiments, the bottom portion 241 has an inclined side surface since the top portion 243 has a curve side surface. The ratio of the thickness of the bottom portion to the thickness of the top portion is in a range from about 2/3 to about 3/2. In some embodiments, the ratio is in a range from about 3/7 to about 7/3. If the ratio is higher or lower than above ratio, the shape of the edge section 244 would be in a shape of triangle, and the edge section 244 would have greater width extended from the center section 242, such situation is unwanted and raises the issue of volume loss. The shape of the magnetic core 240 is more like a rectangle, such that the magnetic core 240 has less volume loss comparing with the transitional magnetic core 14' disclosed in FIG. 2. Thus the performance of the inductor 200 is improved.

Figure 8:
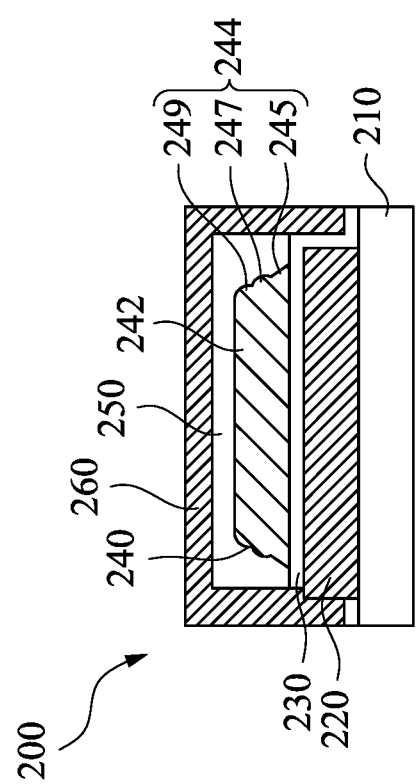
FIG. 8 is a cross-sectional view of the inductor, in accordance with some embodiments.

FIG. 8 is a cross-sectional view of the inductor, in accordance with some embodiments. The difference between the FIG. 8 and FIG. 6 is that the magnetic core 240 of FIG. 8 is fabricated by the method disclosed in FIG. 5. The magnetic core 240 includes the center section 242 and the edge section 244 connected to the center section 242. The edge section 244 includes at least three different slopes. The edge section 244 includes a bottom portion 245, a middle portion 247, and a top portion 249. The bottom portion 245 is disposed on the bottom dielectric layer 230, the middle portion 247 is disposed on the bottom portion, and the top portion 249 is disposed on the middle portion 247. The width of the bottom portion 245 extended from the center section 242 is greater than the width of the middle portion 247 extended from the center section 242. The width of the middle portion 247 extended from the center portion 242 is greater than the width of the top portion 249 extended from the center portion 242. The bottom portion 245 has an inclined side surface. The middle portion 247 has a curve surface. The top portion has a curve surface. The shape of the magnetic core 240 is similar to a rectangle. The volume loss of the magnetic core 240 is very small, thus the inductor 200 using the magnetic core 240 has good performance.

The method for fabricating a magnetic core includes using multiple wet etching processes, such that the profile of the magnetic core can be more rectangular thereby providing better inductor performance.

An aspect of the disclosure provides a method for fabricating a magnetic core. The method includes depositing a magnetic layer on a dielectric layer, forming a first photoresist layer on the magnetic layer and patterning the first photoresist layer, etching the magnetic layer through the patterned first photoresist layer, in which a first section of the magnetic layer exposed by the first photoresist layer remains on the dielectric layer after the magnetic layer is etched, removing the patterned first photoresist layer, forming a second photoresist layer on the magnetic layer and patterning the second photoresist layer, etching the magnetic layer through the patterned second photoresist layer, and removing the second photoresist layer.

According to some embodiments, the first photoresist layer and the second photoresist layer are patterned using the same mask.

According to some embodiments, a portion of the patterned second photoresist layer covering a second section of the magnetic layer is larger than a portion of the patterned first photoresist layer covering the second section of the magnetic layer.

According to some embodiments, the first section of the magnetic layer exposed by the patterned second photoresist layer is removed from the dielectric layer after etching the magnetic layer through the patterned second photoresist layer.

According to some embodiments, the first section of the magnetic layer exposed by the patterned second photoresist layer remains on the dielectric layer after etching the magnetic layer through the patterned second photoresist layer.

According to some embodiments, the method includes forming a third photoresist layer on the magnetic layer and patterning the third photoresist layer, etching the magnetic layer through the patterned third photoresist layer, in which the first section of the magnetic layer exposed by the patterned third photoresist layer is removed from the dielectric layer after etching the magnetic layer through the patterned third photoresist layer, and removing the patterned third photoresist layer.

According to some embodiments, the first photoresist layer, the second photoresist layer, and the third photoresist layer are patterned using the same mask.

According to some embodiments, etching the magnetic layer through the patterned first photoresist layer is performed using a wet etching process.

Another aspect of the disclosure provides a method for fabricating a magnetic core. The method includes depositing a magnetic layer over a dielectric layer, etching the magnetic layer through a first patterned photoresist layer, in which a first section of the magnetic layer is exposed by the first patterned photoresist layer, and a second section of the magnetic layer is covered by the first patterned photoresist layer, and etching the first section of the magnetic layer through a second patterned photoresist layer, wherein the second section of the magnetic layer is covered by the second patterned photoresist layer.

According to some embodiments, the method includes removing the first patterned photoresist layer prior to etching the first section of the magnetic layer through the second patterned photoresist layer.

According to some embodiments, the first section of the magnetic layer is removed from the dielectric layer after etching the first section of the magnetic layer through the second patterned photoresist layer.

According to some embodiments, the first section of the magnetic layer remains on the dielectric layer after etching the first section of the magnetic layer through the second patterned photoresist layer.

According to some embodiments, etching the magnetic layer through the first patterned photoresist layer is performed using a wet etching process.

According to some embodiments, etching the first section of the magnetic layer through the second patterned photoresist layer is performed using a wet etching process.

According to some embodiments, the first patterned photoresist layer and the second patterned photoresist layer are patterned using the same mask.

According to some embodiments, a portion of the second patterned photoresist layer covering the second section of the magnetic layer is larger than a portion of the first patterned photoresist layer covering the second section of the magnetic layer.

Another aspect of the disclosure provides a method for fabricating a magnetic core. The method includes depositing a magnetic layer over a dielectric layer, etching the magnetic layer, such that the magnetic layer having a first section and a second section, and the second section is thicker than the first section, forming a first patterned photoresist layer over the second section, wherein the first section is exposed by the first patterned photoresist layer, etching the first section through the first patterned photoresist layer, and removing the first patterned photoresist layer.

According to some embodiments, the first section is removed from the dielectric layer after etching the first section through the first patterned photoresist layer.

According to some embodiments, the first section remains on the dielectric layer after etching the first section through the first patterned photoresist layer.

According to some embodiments, the method includes forming a second patterned photoresist layer over the second section, in which the first section is exposed by the second patterned photoresist layer, and etching the first section through the second patterned photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a magnetic core, comprising:
   depositing a magnetic layer on a dielectric layer;
   forming a first photoresist layer on the magnetic layer and patterning the first photoresist layer;
   etching the magnetic layer through the patterned first photoresist layer, wherein a first section of the magnetic layer exposed by the patterned first photoresist layer remains on the dielectric layer after etching the magnetic layer;
   removing the patterned first photoresist layer;
   forming a second photoresist layer on the magnetic layer and patterning the second photoresist layer such that the patterned second photoresist layer has a curve portion;
   etching the magnetic layer through the patterned second photoresist layer such that the curve portion of the patterned second photoresist layer suspends without support above the magnetic layer; and
   removing the patterned second photoresist layer.

2. The method of claim 1, wherein the first photoresist layer and the second photoresist layer are patterned using the same mask.

3. The method of claim 1, wherein a portion of the patterned second photoresist layer covering a second section of the magnetic layer is larger than a portion of the patterned first photoresist layer covering the second section of the magnetic layer.

4. The method of claim 1, wherein the first section of the magnetic layer exposed by the patterned second photoresist layer is removed from the dielectric layer after etching the magnetic layer through the patterned second photoresist layer.

5. The method of claim 1, wherein the first section of the magnetic layer exposed by the patterned second photoresist layer remains on the dielectric layer after etching the magnetic layer through the patterned second photoresist layer.

6. The method of claim 5, further comprising:
   forming a third photoresist layer on the magnetic layer and patterning the third photoresist layer;
   etching the magnetic layer through the patterned third photoresist layer, wherein the first section of the magnetic layer exposed by the patterned third photoresist layer is removed from the dielectric layer after etching the magnetic layer through the patterned third photoresist layer; and
   removing the patterned third photoresist layer.

7. The method of claim 6, wherein the first photoresist layer, the second photoresist layer, and the third photoresist layer are patterned using the same mask.

8. The method of claim 1, wherein etching the magnetic layer through the patterned first photoresist layer is performed using a wet etching process.

9. A method for fabricating a magnetic core, comprising:
   depositing a magnetic layer over a dielectric layer;
   forming a first patterned photoresist layer over the magnetic layer, wherein a first section of the magnetic layer is exposed by the first patterned photoresist layer, and a second section of the magnetic layer is covered by the first patterned photoresist layer;
   etching the first section of the magnetic layer through the first patterned photoresist layer;
   forming a second patterned photoresist layer over the magnetic layer, wherein the first section of the magnetic layer is exposed by the second patterned photoresist layer, and the second section of the magnetic layer is covered by the second patterned photoresist layer; and
   etching again the first section of the magnetic layer through the second patterned photoresist layer.

10. The method of claim 9, further comprising removing the first patterned photoresist layer prior to etching the first section of the magnetic layer through the second patterned photoresist layer.

11. The method of claim 9, wherein the first section of the magnetic layer is removed from the dielectric layer after etching the first section of the magnetic layer through the second patterned photoresist layer.

12. The method of claim 9, wherein the first section of the magnetic layer remains on the dielectric layer after etching the first section of the magnetic layer through the second patterned photoresist layer.

13. The method of claim 9, wherein etching the magnetic layer through the first patterned photoresist layer is performed using a wet etching process.

14. The method of claim 9, wherein etching the first section of the magnetic layer through the second patterned photoresist layer is performed using a wet etching process.

15. The method of claim 9, wherein the first patterned photoresist layer and the second patterned photoresist layer are patterned using the same mask.

16. The method of claim 9, wherein a portion of the second patterned photoresist layer covering the second section of the magnetic layer is larger than a portion of the first patterned photoresist layer covering the second section of the magnetic layer.

17. A method for fabricating a magnetic core, comprising:
   depositing a magnetic layer over a dielectric layer;
   etching the magnetic layer, such that the magnetic layer having a pair of first sections and a second section between the first sections, and the second section is thicker than the first sections;
   forming a first patterned photoresist layer over the second section, wherein the first sections are exposed by the first patterned photoresist layer;
   etching the first sections through the first patterned photoresist layer such that at least one of the first sections has a convex sidewall; and
   removing the first patterned photoresist layer.

18. The method of claim 17, wherein the first sections are removed from the dielectric layer after etching the first sections through the first patterned photoresist layer.

19. The method of claim 17, wherein the first sections remain on the dielectric layer after etching the first sections through the first patterned photoresist layer.

20. The method of claim 19, further comprising:
   forming a second patterned photoresist layer over the second section, wherein the first sections are exposed by the second patterned photoresist layer; and
   etching the first sections through the second patterned photoresist layer.

* * * * *